United States Patent [19]

Ueda

[11] Patent Number: 4,797,719

[45] Date of Patent: Jan. 10, 1989

[54] MOS CAPACITOR WITH DIRECT POLYCRYSTALLINE CONTACT TO GROOVED SUBSTRATE

[75] Inventor: Seiji Ueda, Otsu, Japan

[73] Assignee: Matsushita Electronics Corporation, Osaka, Japan

[21] Appl. No.: 171,177

[22] Filed: Mar. 21, 1988

Related U.S. Application Data

[63] Continuation of Ser. No. 846,902, Apr. 1, 1986, abandoned.

[30] Foreign Application Priority Data

Apr. 3, 1985 [JP] Japan .................... 60-70278

[51] Int. Cl.[4] .................... H01L 29/78
[52] U.S. Cl. .................... 357/23.6; 357/41; 357/54; 357/55; 357/59; 365/149
[58] Field of Search .................... 357/23.6, 41, 54, 55, 357/59; 365/149

[56] References Cited

FOREIGN PATENT DOCUMENTS

| 85988 | 8/1983 | European Pat. Off. ............ 357/23.6 |
| 108390 | 5/1984 | European Pat. Off. ............ 357/23.6 |
| 118878 | 8/1984 | European Pat. Off. . |
| 150597 | 4/1985 | European Pat. Off. . |
| 59-103372 | 6/1984 | Japan .................... 357/23.6 |
| 59-106146 | 6/1984 | Japan .................... 357/23.6 |
| 59-191374 | 10/1984 | Japan .................... 357/23.6 |
| 60-38855 | 2/1985 | Japan .................... 357/23.6 |
| 2138207 | 8/1984 | United Kingdom . |

OTHER PUBLICATIONS

M. Koyanagi et al., "Novel High Den., Stacked Cap. MOS RAM," Jap. J. A. P., vol. 18, 1979, Suppl. 18-1, pp. 35-42.

D. Kenney, "Reduced Bit Line Cap. in VMOS Devices," IBM Tech. Discl. Bull., vol. 23, #9, Feb. 1981, pp. 4052-4053.

Japanese Patent Abstracts., vol. 9, No. 159 (E-326) Jul. 4, 1985, JP 60038855(1).

Primary Examiner—Joseph E. Clawson, Jr,
Attorney, Agent, or Firm—Spencer & Frank

[57] ABSTRACT

A MOS capacitor comprising a semiconductor substrate having a pair of spaced trenches in one surface. An isolation region is located in the substrate between the trenches and first polycrystalline silicon films are formed within each of the trenches directly on the substrate. Insulating films are formed on the first polycrystalline film, and a second polycrystalline film is formed on the insulating films. The first and second polycrystalline films function as first and second electrodes of the MOS capacitor and the insulating film as a dielectric layer of the capacitor.

10 Claims, 2 Drawing Sheets

MOS CAPACITOR WITH DIRECT POLYCRYSTALLINE CONTACT TO GROOVED SUBSTRATE

This application is a continuation of application Ser. No. 06/846,902, filed Apr. 1st, 1986, now abandoned.

BACKGROUND OF THE INVENTION

Recently, MOS dynamic RAMs (hereinafter referred to as DRAMs) having a large storage capacity on the order of a mega-bit have been realized. In keeping with such a trend, DRAMs have been designed to achieve higher density by reducing the size of the memory cells contained therein.

The present invention relates to a MOS capacitor and a method of manufacturing it, and in particular, to a MOS capacitor suitable for increasing the density of a DRAM and a method of manufacturing such a MOS capacitor.

With progress in the study of means for increasing the degree of integration of the DRAM, a DRAM having a capacity as large as several mega-bits has been reported. However, since the size of a chip generally increases as the storage capacity is increased, in order to achieve practical use, it is necessary to increase the density by further reducing the size of the memory cell.

The area of the memory cell per 1 bit is in a range from 50 to 70 $\mu m^2$ for a DRAM of 256 kb, and the area must be reduced to a range from 20 to 30 $\mu m^2$ or less for 1 Mb. However, taking a soft error and noise margin into consideration, it is necessary that the capacity of a capacitor constituting the memory cell be made substantially comparable to the DRAM of 256 kb.

In order to maintain the capacity of the capacitor of the memory cell comparable to that of the DRAM of 256 kb while reducing the memory cell area, there is a method in which the effective film thickness of an insulating film (hereinafter referred to as a capacitor insulating film) which is a constituent element of the capacitor is reduced, or another method in which the effective area of the capacitor insulating film is increased.

However, in the former method, since it is difficult to make a silicon dioxide film thinner than about 10–15 $\mu m$ in view of pinholes and the like, there exists a limitation.

On the other hand, a trench-shaped capacitor is known in which, in order to eliminate the drawbacks mentioned above, a trench of several $\mu m$ in depth is formed in the semiconductor substrate, and by forming a capacitor on the inner wall of the trench, the effective area of the capacitor is increased (e.g., Kiyoo Itoh et al, "256 k/1 Mb DRAMS-II", 1984, ISSCC, pages 282–288).

The trench-shaped capacitor of this structure is a kind of MOS capacitor structure in which an element isolation region is formed in the silicon substrate by a selective oxidation method, trenches are formed adjacent to the element isolation region and sandwiching this region, insulating films are respectively formed on inner walls of these trenches, and the trenches are filled up by forming polycrystalline silicon films on the insulating films so that the insulating films constitute dielectric layers and the silicon substrate and the polycrystalline silicon films are used as electrodes.

The trench-shaped capacitor mentioned above is designed to reduce the area of the memory cell by forming the trenches in the silicon substrate and forming the capacitor on the inner walls. However, when the trench-shaped capacitors are formed adjacent to both sides of the element isolation region formed by the selective oxidation method, punch-through will be caused between the adjacent capacitors, and reducing the isolation width will become difficult. Moreover, since the selective oxidation method is employed in the element isolation, there arises a problem in that the generation of a "bird's beak" can not be avoided and higher integration can not be achieved.

Furthermore, a crystal defect or the like will occur in the silicon substrate during the trench forming process and the heat treatment process will cause a leakage in the substrate and a defect in the capacitor insulating film. These problems pose a large obstacle in manufacturing a large capacity memory.

SUMMARY OF THE INVENTION

A first object of the present invention is to provide a MOS capacitor and a manufacturing method in which an element isolation region of high isolation dielectric strength is formed.

A second object of the present invention is to form an element isolation region which has a reduced isolation width and which is suitable for being made in a microstructure.

A third object of the present invention is to form an insulating film for a MOS capacitor which is not influenced by a crystal defect present in the substrate.

A fourth object of the present invention is to form a MOS capacitor having a large capacity while being formed in a microstructure.

In the present invention, a capacitor is manufactured through a step of forming a first trench in the main surface of a semiconductor substrate of one conductivity type, after covering an inner wall of the trench with a first insulating film, filling the inside of the first trench with an insulator or a semiconductor material, and forming an element isolation region having the substrate surface flattened; a step of forming at least two trenches of second and third trenches adjacent to both sides of the element isolation region and opposing to each other sandwiching the element isolation region; a step of forming a first polycrystaline silicon film of an opposite conductivity type to that of the semiconductor substrate on the whole of the inner walls of the second and third trenches; a step of forming a second insulating film on the first polycrystalline silicon film; and a step of forming a second conductive polycrystalline silicon film on the second insulating film to fill the second and third trenches, wherein the second insulating film constitutes a dielectric layer and the first and second polycrystalline silicon films serve as electrodes.

According to the structure realized by the method mentioned above, a MOS capacitor is obtained in which a first set of a first polycrystalline silicon film constituting one electrode, a first insulating film constituting a dielectric layer, and a second polycrystalline silicon film constituting the other electrode are formed side by side, and are embedded in a first portion of the semiconductor substrate in substantially perpendicular directions to the main surface of the semiconductor substrate, and at least a second set of a similar composition to that of the first set is embedded in a second portion of the semiconductor substrate, and an isolation region including an insulator or a semiconductor material, and a first insulating film surrounding the insulator or the semiconductor material is embedded between the first and second portions.

In the MOS capacitor and the manufacturing method thereof in the present invention, the element isolation region can be formed to provide high isolation dielectric strength and in a trench shape having a reduced width. Furthermore, since a polycrystalline silicon film is formed on the inner wall of the trench-shaped capacitor, and an insulating film of the capacitor is formed on the polycrystalline silicon film, the capacitor insulating film can be formed in a region which is not influenced by a crystal defect present in the substrate.

While the novel features of the invention are set forth with particularity in the appended claims, the invention, both as to organization and content, will be better understood and appreciated, along with other objects and features thereof, from the following detailed description taken in conjunction with the drawings.

DESCRIPTION OF THE PREFERRED EMBODIMENT

An embodiment of a method of manufacturing a DRAM applied in order to obtain a structure of a MOS capacitor in accordance with the present invention will be described with reference to a flow chart of the process.

Figure 1:
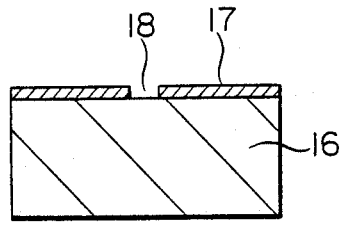
FIGS. 1 to 10 are sectional views illustrating in the order of processes a method of manufacturing a DRAM applied with a method of manufacturing a MOS capacitor in accordance with the present invention.

First, as shown in FIG. 1, a silicon dioxide film 17 is formed on a surface of a P-type silicon substrate 16, and an opening 18 having a width of 1 $\mu$m is formed in a portion intended to be an element isolation region by a photoetching technique.

Figure 2:
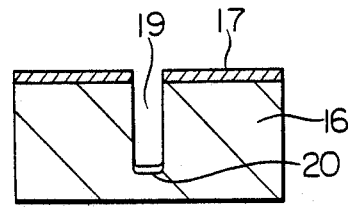

Next, as shown in FIG. 2, a trench 19 having a depth of 5 $\mu$m and a width of 1 $\mu$m is formed in the silicon substrate 16 by reactive ion etching using $CCl_4$ and $O_2$ and by using the silicon dioxide film 17 as a mask. Following this, a channel stopper region 20 is formed on the bottom of the trench 19 by ion implanation of boron.

Figure 3:
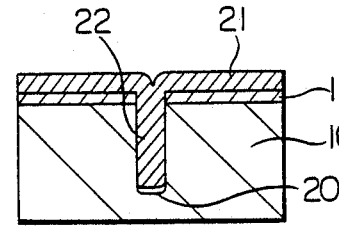

Next, as shown in FIG. 3, after oxidizing thermally the inner wall of the trench 19 and the surface of the silicon substrate 16, silicon dioxide 21 is deposited by a CVD technique to fill the trench 19 with the silicon dioxide 21, and an element isolation region 22 is formed.

Figure 4:
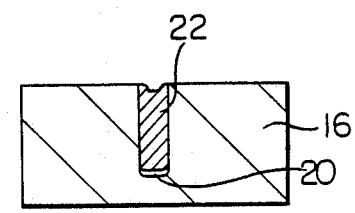

In this respect, as a technique for filling the trench 19, another technique may be used in which after the silicon dioxide is formed on the inner wall of the trench 19, a polycrystalline silicon layer is formed by the CVD technique thereby to fill the trench 19 with this polycrystalline silicon layer. Following this, as shown in FIG. 4, the silicon dioxide films 17 and 21 formed on the main surface of the substrate 16 are removed entirely by etching.

Figure 5:
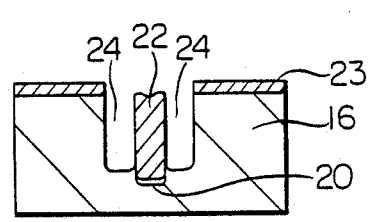

Next, as shown in FIG. 5, a new silicon dioxide film 23 is formed on the surface of the silicon substrate 16, and further, by the photoetching technique, openings for forming trench-shaped capacitors are formed at areas located at both sides of the element isolation region 22 and adjoining this region 22. Following this, reactive ion etching is applied to silicon substrate portions exposed at the inside of these openings, and trenches 24 and 24 each having a depth of 4 $\mu$m and a width of 1 $\mu$m are formed in the silicon substrate 16. These trenches 24 and 24 each having a U- or V-shaped cross section are located at both sides of the element isolation region 22 and are of a construction adjoining the element isolation region 22.

Figure 6:
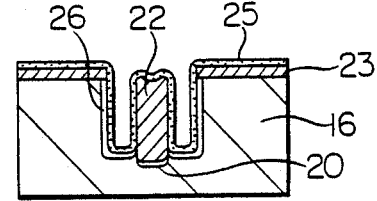

Next, as shown in FIG. 6, an N-conductivity type polycrystalline silicon film 25 containing phosphorus (P) is grown to a film thickness of about 200 nm on the inner walls of the trenches 24 and 24, and then N-type diffusion layers 26 and 26 are formed by diffusing the phosphorus contained in the polycrystalline silicon film 25 into the silicon substrate 16, and the silicon substrate 16 and the polycrystalline silicon film 25 are electrically connected.

Figure 7:
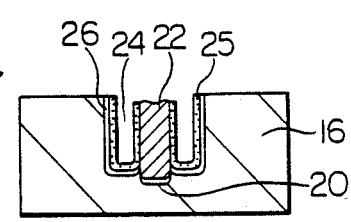

Next, after coating a resist (not shown) all over the polycrystalline silicon film 25 to fill the trenches 24 and 24 with the resist, the resist film on the surface is removed by reactive ion etching using an oxygen gas, and leaves the resist only in the inside of the trenches 24 and 24. In this condition, the polycrystalline silicon film 25 and the silicon dioxide film 23 on the surface are sequentially removed. Thereafter, the resist in the inside of the trenches 24 and 24 are removed, and the resulting condition is shown in FIG. 7.

Figure 8:
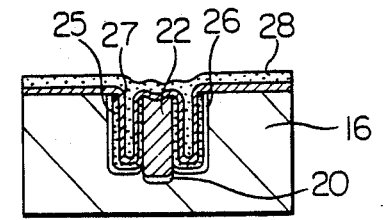

Next, as shown in FIG. 8, a silicon dioxide film 27 is formed so that an effective oxide film thickness of 15 nm is obtained which functions as a capacitor insulating film. On this silicon dioxide film 27, a polycrystalline silicon film 28 containing phosphorus and intended to constitute the other electrode of a capacitor is formed to a thickness of 500 nm, and the surface is flattened by filling the trenches each having a width of 1 $\mu$m.

Figure 9:
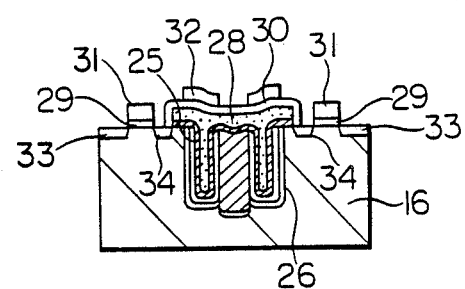

Next, as shown in FIG. 9, the polycrystalline silicon film 28 on the surface is selectively removed, and an electrode pattern for the capacitor is formed. Following this, a gate oxide film 29 of an access MOS transistor is formed, and further, a layer insulating film 30 for insulating the capacitor electrode from a word line is formed. Then, after a gate electrode 31 made of tungsten or aluminum and the word line connected to the gate electrode 31 are formed, N-type diffusion regions 33 and 34 intended to serve as a source and a drain region are formed.

Figure 10:
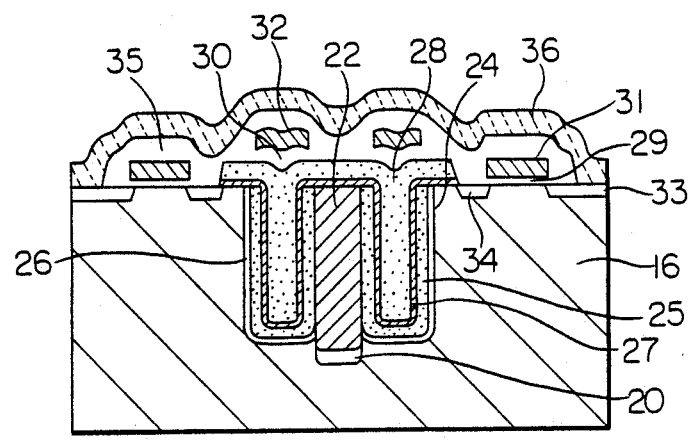

Next, as shown in FIG. 10, a layer insulating film 35 for insulating the word line 32 from a bit line is formed, and hereinafter, an opening for forming an electrode is formed in the N-type diffusion region 33, and aluminum wiring is selectively formed so that one end of the bit line 36 is connected to this opening.

Lastly, a memory cell of a DRAM is completed by forming a protective coat (not shown).

In this respect, the N-type diffusion layer 26 formed on the substrate side of the inner wall of each trench 24 shown in the embodiment may be omitted, and in this case, although the capacitor capacity decreases by about 10%, the effect of reduction of the memory cell area is not changed.

The memory cell of the DRAM formed by the MOS capacitor and the manufacturing method thereof in accordance with the present invention provides a capacity of 60 fF although the element isolation width and the trench width of the capacitor are reduced to 1 $\mu$m.

Moreover, even when the element isolation trench width is made 1 $\mu$m the substrate resistivity is about 4–5 $\Omega$ cm, and the dielectric strength between elements of 20 V can also be obtained.

Further, when this manufacturing method is used for a DRAM, since an insulating film is formed on a polycrystalline silicon film after the polycrystalline silicon film is formed on the inner wall of a trench for forming a capacitor, the capacitor insulating film for the DRAM is not influenced by a defect present in the silicon substrate due to work strain or the like. Thus, a DRAM having high dielectric strength, and still having an improved time characteristic (Pause time) since the charges stored in the capacitor naturally disappear due to leakage, can be obtained.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention.

I claim:

1. A MOS capacitor comprising:
a semiconductor substrate having a principal surface and a pair of spaced trenches formed in said principal surface, each of said trenches being defined by side walls, having first and second parts, and a bottom, said first parts of the side walls and the bottoms of said trenches being inner surfaces of said substrate;
an isolation region embedded in said semiconductor substrate only between said pair of trenches, said isolation region having a pair of side walls which extend in a direction substantially perpendicular to the principal surface of said substrate and define said second parts of the side walls of said trenches;
first polycrystalline silicon films formed within each of said trenches directly on said first parts, said second parts and said bottoms of said trenches, said first polycrystalline films serving as a first electrode of said MOS capacitor;
insulating films formed on said first polycrystalline films, said insulating films constituting dielectric layers of said MOS capacitor; and
a second polycrystalline silicon film formed on said insulating films, said second polycrystalline film serving as a second electrode of said MOS capacitor, whereby said first polycrystalline silicon films are disposed entirely between the bottoms of said trenches and said insulating films.

2. The MOS capacitor of claim 1, wherein said first polycrystalline silicon films have a conductivity type opposite to that of said semiconductor substrate.

3. The MOS capacitor of claim 1 wherein said second polycrystalline film formed on the insulating film within at least one of said trenches is in the form of a column.

4. The MOS capacitor of claim 1 wherein said entire isolation region is formed of silicon dioxide.

5. The MOS capacitor of claim 1, wherein said isolation region comprises:
an inner core portion of polycrystalline silicon; and
an outer portion of silicon dioxide, said outer portion surrounding said inner core portion.

6. A MOS capacitor comprising:
a semiconductor substrate of one conductivity type having a principal surface and a pair of spaced trenches formed in said principal surface, each of said trenches being defined by side walls, having first and second parts, and a bottom, said first parts of the side walls and the bottoms of said trenches being inner surfaces of said substrate;
an isolation region embedded in said semiconductor substrate only between said pair of trenches, said isolation region having a pair of side walls which extend in a direction substantially perpendicular to the principal surface of said substrate and define said second parts of the side walls of said trenches;
diffused regions of the other conductivity type formed in said semiconductor substrate adjacent the first parts and the bottoms of said trenches;
first polycrystalline silicon films of the other conductivity type formed within each of said trenches directly on said first parts, said second parts and said bottoms of said trenches, said first polycrystalline films serving as a first electrode of said MOS capacitor;
insulating films formed on said first polycrystalline films, said insulating films constituting dielectric layers of said MOS capacitor; and
a second polycrystalline silicon film formed on said insulating films, said second polycrystalline film serving as a second electrode of said MOS capacitor, whereby said first polycrystalline silicon films are disposed entirely between the bottoms of said trenches and said insulating films.

7. The MOS capacitor of claim 6, wherein said second polycrystalline film formed on the insulating film within at least one of said trenches is in the form of a column.

8. The MOS capacitor of claim 6 wherein said entire isolation region is formed of silicon dioxide.

9. The MOS capacitor of claim 6, wherein said isolation region comprises
an inner core portion of polycrystalline silicon; and
an outer portion of silicon dioxide, said outer portion surrounding said inner core portion.

10. The MOS capacitor of claim 1 wherein the depth of said isolation region is greater than that of said trenches.

* * * * *